(12) United States Patent
LaBerge

(10) Patent No.: US 7,355,387 B2
(45) Date of Patent: Apr. 8, 2008

(54) SYSTEM AND METHOD FOR TESTING INTEGRATED CIRCUIT TIMING MARGINS

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/297,901

(22) Filed: Dec. 8, 2005

(65) Prior Publication Data

US 2007/0132443 A1  Jun. 14, 2007

(51) Int. Cl.
G01R 31/28  (2006.01)

(52) U.S. Cl. .................................. 324/158.1

(58) Field of Classification Search ........... 324/765, 324/760, 158.1, 76.54, 617, 601; 714/736, 714/733, 700, 724; 327/163, 156
See application file for complete search history.

(56) References Cited

U.S. PATENT DOCUMENTS

| | | | |
|---|---|---|---|
| 4,637,020 A | 1/1987 | Schinabeck | 371/20 |
| 4,646,299 A | 2/1987 | Schinabeck et al. | 371/20 |
| 4,717,012 A | 1/1988 | Swapp et al. | 198/425 |
| 4,776,747 A | 10/1988 | Swapp et al. | 414/417 |
| 4,928,062 A | 5/1990 | Miles et al. | 324/158 R |
| 5,055,799 A | 10/1991 | Kerschner et al. | 324/158 F |
| 5,321,702 A | 6/1994 | Brown et al. | 714/744 |
| 5,539,305 A | 7/1996 | Botka | 324/158.1 |
| 5,652,524 A | 7/1997 | Jennion et al. | 324/765 |
| 5,751,151 A | 5/1998 | Levy et al. | 324/537 |
| 5,805,619 A | 9/1998 | Gardner et al. | 714/814 |
| 5,864,565 A | 1/1999 | Ochoa et al. | 371/24 |
| 5,903,163 A | 5/1999 | Tverdy et al. | 324/760 |
| 6,004,142 A | 12/1999 | Wark | 439/74 |
| 6,087,857 A * | 7/2000 | Wang | 327/5 |
| 6,147,506 A | 11/2000 | Ahmad et al. | 324/760 |
| 6,219,305 B1 * | 4/2001 | Patrie et al. | 368/113 |
| 6,369,601 B1 * | 4/2002 | Ishigaki | 324/765 |
| 6,373,268 B1 | 4/2002 | Dunlap et al. | 324/755 |
| 6,407,567 B1 | 6/2002 | Etter | 324/760 |
| 6,438,721 B1 | 8/2002 | Wente | 714/731 |
| 6,449,741 B1 | 9/2002 | Organ et al. | 714/724 |
| 6,551,844 B1 | 4/2003 | Eldridge et al. | 438/14 |
| 6,583,636 B2 | 6/2003 | Brule | 324/755 |
| 6,631,488 B1 | 10/2003 | Stambaugh et al. | 714/746 |
| 6,696,848 B2 | 2/2004 | Robinson | 324/755 |
| 6,791,317 B1 | 9/2004 | Walsh et al. | 324/158.1 |
| 6,829,181 B1 | 12/2004 | Seitoh | 365/201 |

(Continued)

*Primary Examiner*—Ha Tran Nguyen
*Assistant Examiner*—Tung X. Nguyen
(74) *Attorney, Agent, or Firm*—Dorsey & Whitney LLP

(57) ABSTRACT

An integrated circuit load board includes a substrate on which a plurality of integrated circuit sockets and an integrated test circuit are mounted. The integrated test circuit includes circuitry for testing the timing margins of memory devices by determining the relative timing between read data and data strobe signals applied to a memory device. The relative timing between the read data and data strobe signals is determined by using a delay line to delay the data strobe signal over a range of delays, and determining a final delay that causes the transitions of the delayed data strobe signal to coincide with the transitions of the read data signals. The time corresponding to the final delay is then determined by using a phase interpolator to generate a range of phase offset signals having known delay times until a phase offset signal has the same delay as the final delay.

40 Claims, 6 Drawing Sheets

U.S. PATENT DOCUMENTS

| | | |
|---|---|---|
| 6,856,154 B2 | 2/2005 | Song et al. .................. 324/754 |
| 7,188,219 B2 | 3/2007 | Jeddeloh ..................... 711/154 |
| 7,213,082 B2 | 5/2007 | Jeddeloh ....................... 710/5 |
| 7,234,070 B2 | 6/2007 | James ........................ 713/503 |
| 7,243,278 B2 | 7/2007 | Arkin ......................... 714/724 |
| 2004/0034825 A1 | 2/2004 | Jeddeloh ..................... 714/733 |
| 2005/0023560 A1 | 2/2005 | Ahn et al. ................... 257/200 |
| 2005/0060600 A1 | 3/2005 | Jeddeloh ........................ 714/5 |
| 2005/0278495 A1 | 12/2005 | Lee ............................ 711/168 |
| 2005/0283681 A1 | 12/2005 | Jeddeloh ....................... 714/42 |
| 2006/0107186 A1 | 5/2006 | Cowell et al. .............. 714/776 |
| 2006/0206761 A1 | 9/2006 | Jeddeloh ....................... 714/29 |

* cited by examiner

SYSTEM AND METHOD FOR TESTING INTEGRATED CIRCUIT TIMING MARGINS

TECHNICAL FIELD

This invention relates to testing integrated circuits such as memory devices, and, more particularly, to a system and method for precisely testing the timing margins of integrated circuits.

BACKGROUND OF THE INVENTION

During the fabrication of integrated circuits such as memory devices, it is conventional to test such integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board that are connected to the integrated circuits. The test head is connected through a cable to a high-speed tester so that the tester can apply signals to and receive signals from the integrated circuits.

While the above-described testing environment works well in many applications, it is not without its limitations and disadvantages. For example, it is very difficult to test various timing characteristics of the integrated circuits, particularly at the high operating speeds for which such integrated circuits are designed. This difficulty in testing timing characteristics results primarily from the propagation delays in the cable coupling the tester to the test head. The cables that are typically used in such testing environments are often fairly long, thus making the delays of signals coupled to and from the integrated circuits correspondingly long and often difficult to predict.

Another problem with the above-described testing environment is that it may not accurately simulate the conditions in which the integrated circuits will be actually used. In actual use, integrated circuits, such as dynamic random access memory ("DRAM") devices are typically mounted on a printed circuit board. Signals are applied to the integrated circuits by other integrated circuits mounted on the board, and signals generated by the integrated circuits are received by other integrated circuits mounted on the board. In most applications, signals are not coupled to and from the integrated circuits through long cables coupled to distant electronic devices. Therefore, the testing environment is normally quite different from the environment in which the integrated circuits will operate in normal use.

While techniques have been developed to deal with these difficulties, the use of these techniques results in testers that are highly complex and often very expensive. A large number of testers are normally required for a high capacity semiconductor fabrication plant, thus greatly increasing the cost of the plant and the expense of testing the integrated circuits.

One improved testing system that has been proposed is to fabricate an integrated test circuit that performs most if not all of the functions of conventional testers, and mount the integrated test circuit on the test head or load board to which the integrated circuits being tested are coupled. By placing the testing function on the test head or load board itself, the problems inherent in coupling test signals between a testing system and a test head are eliminated. As a result, the circuits can be tested in a more realistic environment. Furthermore, since even custom integrated circuits can be fabricated relatively inexpensively, the cost of testing systems can be greatly reduced.

One difficulty in using an integrated test circuit in this manner stems from the difficulty in accurately testing timing margins of integrated circuits, such as memory devices. For example, two memory device timing parameters that are normally tested are the maximum data set-up time, which is abbreviated as $t_{DQSQ}$, and the minimum data hold time, which is abbreviated as $t_{QH}$. In source synchronous data transfers, read data signals DQ are transmitted in synchronism with a data strobe signal DQS. With reference to FIG. 1, the data strobe signal DQS transitions active at time $t_0$, and the read data signals DQ thereafter become valid. The maximum time needed for the read data signals DQ to become valid after the transition of DQS at $t_0$, i.e., the data set up time $t_{DQSQ}$, is normally specified for a memory device. Similarly, the minimum time that the read data signals DQ must remain valid after the transition of DQS at $t_0$, i.e., the data hold time $t_{QH}$, is also normally specified for a memory device.

The time between $t_{DQSQ}$ and $t_{QH}$ is the data valid period. The length of the data valid period may be excessively reduced by any increase in the set-up time beyond the specified maximum set-up time $t_{DQSQ}$ or any decrease of the data hold time from the specified minimum data hold time $t_{QH}$. A device receiving the data bits DQ and data strobe DQS signal, such as a memory controller, normally attempts to delay the DQS signal so that it transitions at the center of the data valid period. As the length of the data hold period gets smaller, it becomes more difficult for the memory device to position transitions of the DQS signal in the data valid period. It is therefore important to determine the data set-up and data hold times of a memory device being tested to ensure that a sufficient data valid period can be achieved.

Unfortunately, with modern high-speed memory devices, it is difficult to measure very small time periods, such as $t_{DQSQ}$ and $t_{QH}$, that must be measured to adequately test memory devices. Expensive high-speed testers of the type described above are capable of measuring these very small time periods. However, the lack of a good timing mechanism that can easily be fabricated in an integrated circuit threatens to preclude the use of an integrated test circuit mounted on a load board or test head from accurately testing $t_{DQSQ}$ and $t_{QH}$.

There is therefore a need for a testing system and method that can be easily fabricated in an integrated circuit to allow an integrated test circuit mounted on a load board, test head or the like to accurately measure very small timing margins, such as $t_{DQSQ}$ and $t_{QH}$.

SUMMARY OF THE INVENTION

A system and method of measuring the delay time between first and second signals, such as read data signals and a data strobe signal, delays the first signal over a range of delay values to provide a delayed signal. A final delay value is then obtained by determining the delay value at which transitions of the delayed signal substantially coincide with transitions of the second signal. The final delay value may be determined by storing samples of the second signal in a latch that is clocked by the delayed signal, and then detecting when the value of the stored sample changes. The final delay value provides an indication of the relative timing between the first and second signals. However, the final delay value does not provide an indication of the relative timing between the first and second signals in units of time. The time value corresponding to the final delay value is determined by phase shifting a periodic signal over a range of phases to provide a phase shifted signal. A final phase may then be determined as the phase of the phase shifted signal at which transitions of the phase shifted signal substantially coincide with transitions of the delayed signal while the first signal is delayed by the final delay value.

DETAILED DESCRIPTION

Figure 1:
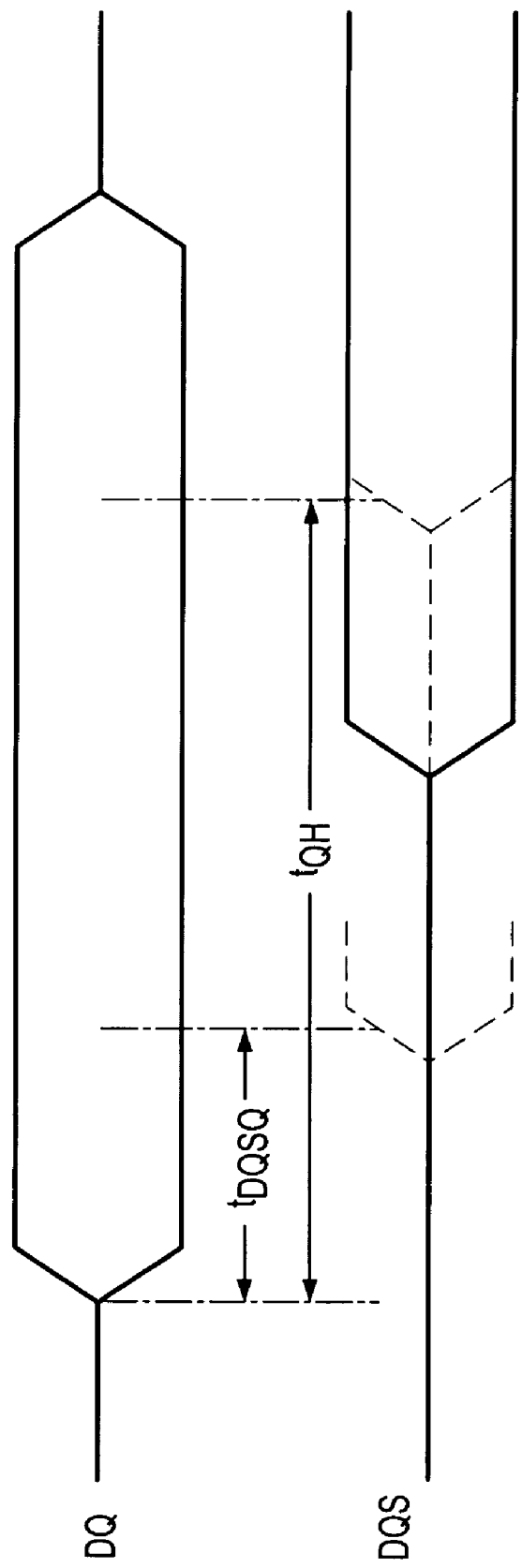
FIG. 1 is a timing diagram showing read data and data strobe signals that are typically received from memory devices and their relative timing, which is typically measured to determine if the memory devices meet performance specifications.
Figure 2:
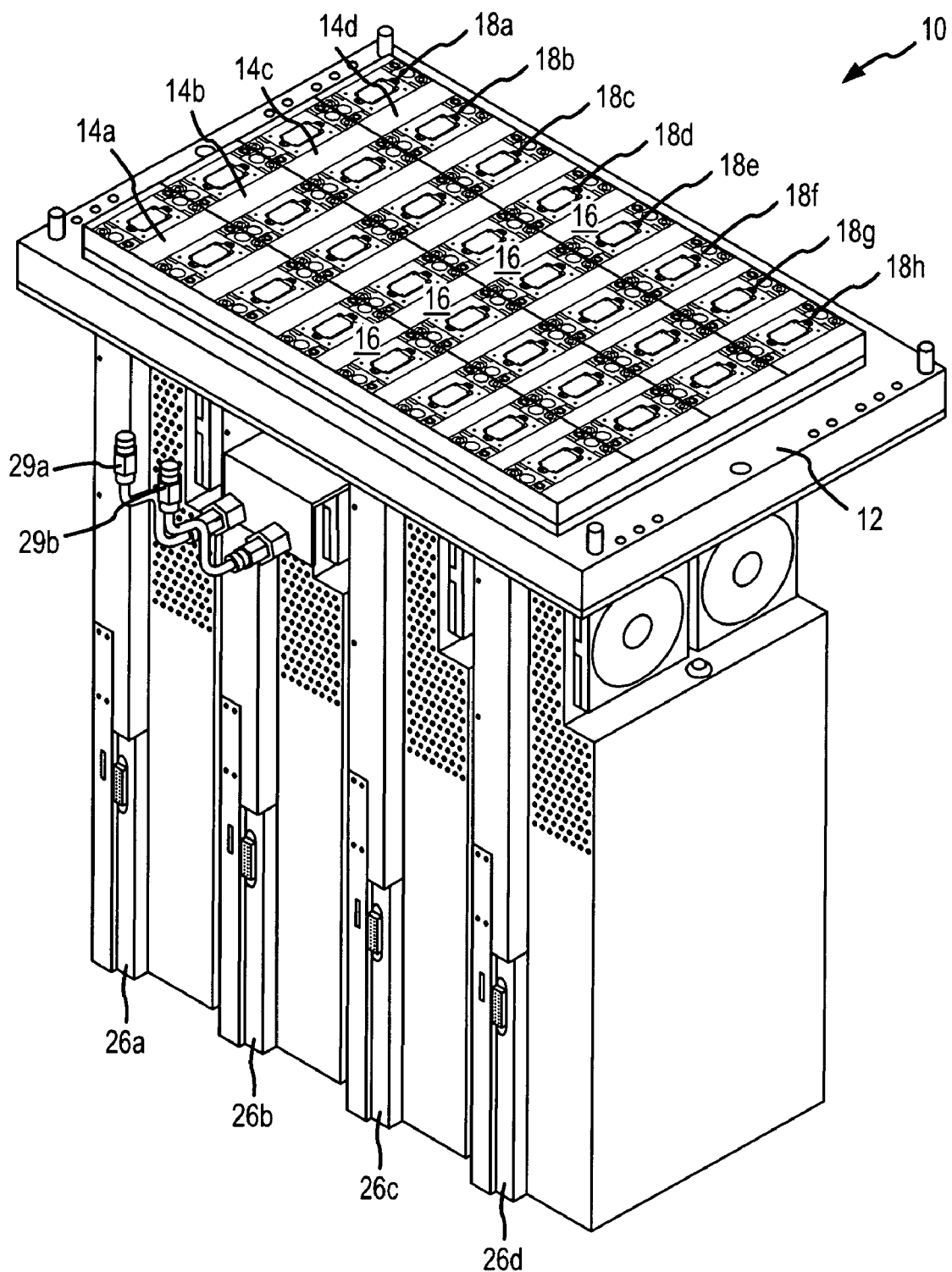
FIG. 2 is an isometric view of a test system according to one example of the invention.

A test system 10 according to one example of the invention is illustrated in FIG. 2. The test system 10 includes a test head 12 on which several load boards 14a-d are placed. Each of the load boards 14a-d have a printed circuit substrate 16 on which several integrated circuit sockets 18a-h are mounted. Each of the integrated circuit sockets 18a-h receives a respective integrated circuit (not shown in FIG. 2). In the example shown in FIG. 2, the sockets 18a-h are adapted to receive integrated circuit memory devices, such as dynamic random access memory ("DRAM") devices. Prior to final testing of the integrated circuits, an integrated circuit handler loads an integrated circuit into each of the sockets 18a-h, and then places each of the load boards 14a-d on the test head 12.

Figure 3A:
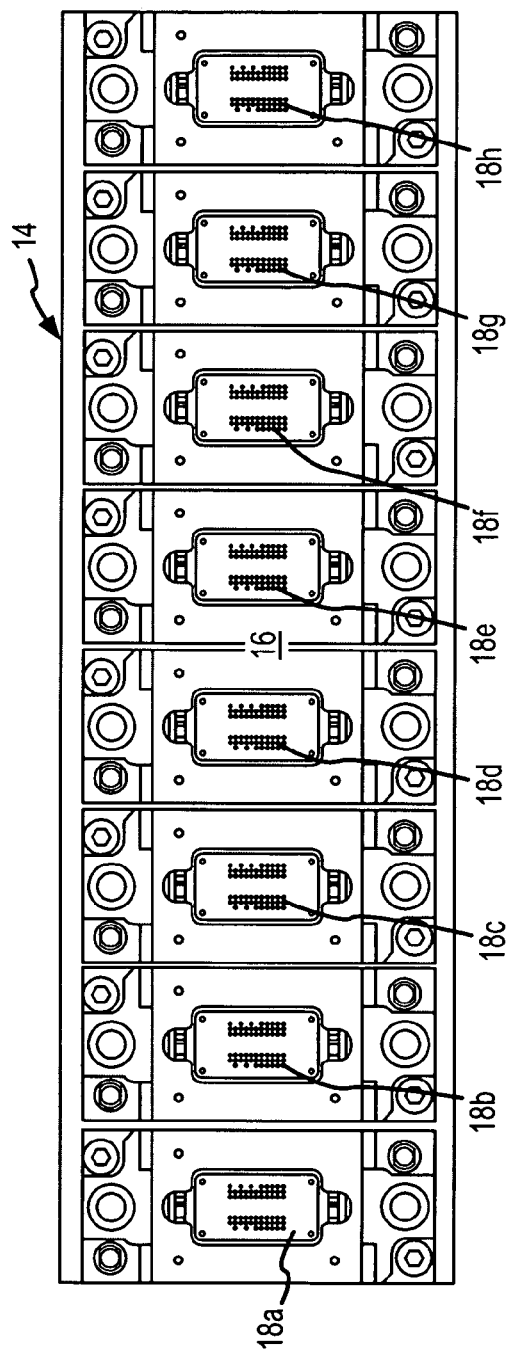
FIGS. 3A and 3B are top and bottom plan views, respectively, of a load board used in the test system of FIG. 2.
Figure 3B:
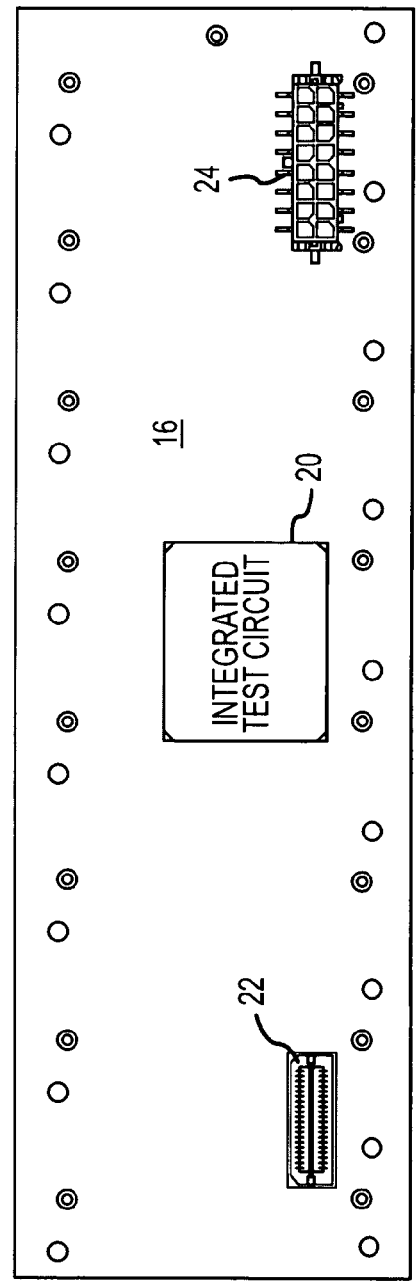

As explained in greater detail below, each of the load boards 14a-d includes an integrated device under test ("DUT") chip (not shown in FIG. 2) mounted on the surface of the substrate 16 opposite the service on which the sockets 18a-h are mounted. The sockets 18a-h are shown mounted on the upper surface of the substrate 16 in greater detail in FIG. 3A. The lower surface of the substrate 16 is shown in FIG. 3B. An integrated test circuit 20 is mounted at the center of the substrate 16, and it is connected to the sockets 18a-h through conventional printed circuit traces (not shown in FIG. 3B). Also mounted on the lower surface of the substrate 16 are a conventional JTAG connector 22 and a power supply connector 24. High-level test commands are applied to the test circuit 20 through the JTAG connector 22, and high-level results data are received from the test circuit 20 through the JTAG connector 22. Power is applied to the test circuit 20 as well as to integrated circuits mounted in the sockets 18a-h through the power supply connector 24.

In operation, the test circuit 20 applies a pattern of signals to the integrated circuits mounted in the sockets 18a-h, and receives signals from the integrated circuits indicative of the circuits' response to the pattern of signals. Insofar as the integrated test circuit is mounted on the same substrate 16 as the integrated circuits, the timing at which the pattern of signals are applied to the integrated circuits can be more precisely controlled. The timing of signals received from the integrated circuits being tested can also be precisely determined using circuitry that will be explained with reference to FIGS. 4-6. Furthermore, the relatively short length of the conductors extending from the integrated test circuit 20 to the integrated circuits in the sockets 18a-h allows the circuitry in the integrated test circuit to be less complex and therefore less expensive than with testers in which a pattern of test signals is applied through a long cable.

With further reference to FIG. 2, the test head 12 is mounted on the upper ends of several power supplies 26a-d, which generate DC supply voltages at respective magnitudes for use by the test head 12 and the load boards 14a-d. As mentioned above, the DC supply voltages are applied to the test head 12 through the power supply connector 24 (FIG. 3B). The test head 12 also includes fluid couplings 29a,b that receive and discharge a cooling fluid, respectively, for maintaining the temperature of the test circuit 20 at a stable acceptably cool temperature.

Figure 4:
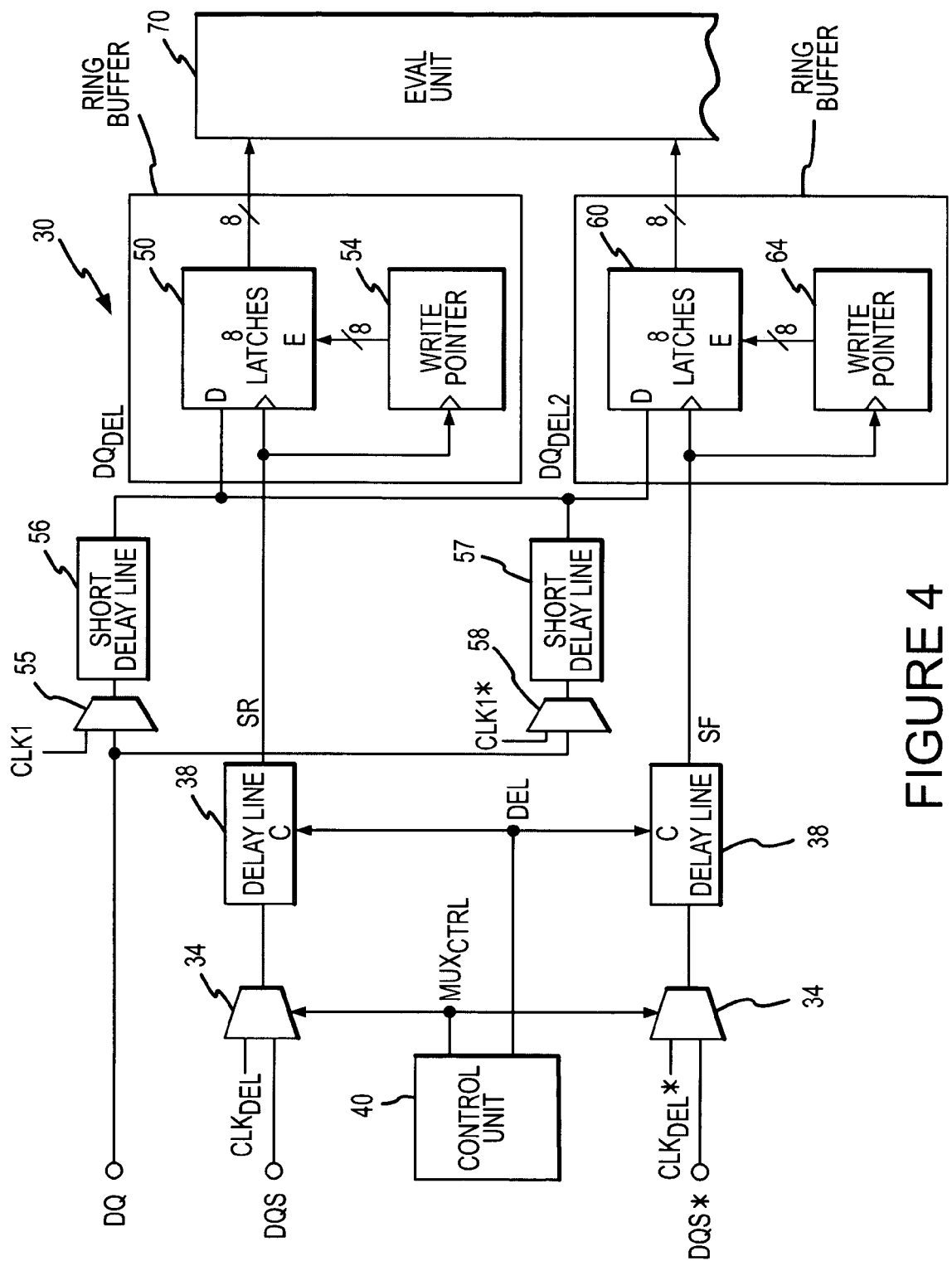
FIG. 4 is a block diagram of measurement circuitry used in the test system of FIGS. 2 and 3 that measures timing margins of circuits being tested.

As mentioned above, the test circuit 20 is capable of precisely determining the timing of signals received from integrated circuits being tested. For example, if the integrated circuits being tested are memory devices, the test circuit 20 can accurately measure the maximum data set-up time $t_{DQSQ}$ as well as the minimum data hold time $t_{QH}$. One example of measurement circuitry 30 included in the test circuit 20 that measures the timing relationship between signals, such as the timing between the DQS signal and read data signals, is shown in FIG. 4. The measurement circuitry 30 receives a data strobe signal DQS and its complement DQS* from a memory device being tested (not shown). The measurement circuitry 30 also receives a number of read data signals $DQ_N$-$DQ_0$, although the circuitry of processing only one of these signals DQ is shown in FIG. 4 for purposes of clarity. However, it will be understood that an extensive amount of circuitry in addition to the circuitry shown in FIG. 4 is provided to process the other read data signals DQ. The DQS signal is applied to one input of a multiplexer 34, which also receives at its second input a $CLK_{DEL}$ signal from circuitry that will be explained with reference to FIG. 6. The output of the multiplexer 34 is applied to a delay line 38. The operation of the multiplexer 34 is controlled by a control signal $MUX_{CTRL}$, which is generated by a control unit 40. The control unit 40 also applies a binary delay value DEL to a control input "C" of the delay line 38 to control the magnitude of the delay provided by the delay line 38.

When the measurement circuitry 30 is being used to measure the timing relationship between the DQS and DQ signals, the control unit 40 causes the multiplexer 34 to couple the DQS signal to the input of the delay line 38. The delay line 38 then delays the DQS signal by the delay value DEL to produce a delayed strobe signal SR.

As explained in greater detail below, the SR signal is applied to circuitry that clocks data that is valid after the rising edge of the DQS signal. However, for some memory devices, known as double data rate "DDR" devices, a strobe signal is needed to clock data on the falling edge of data signals. It is therefore desirable to generate a delayed signal that has a rising edge delayed from the falling edge of the DQS signal. For this reason, the measurement circuitry 30 also receives the complement of the DQS signal, i.e., DQS*, as well as the complement of the $CLK_{DEL}$ signal, $CLK_{DEL}$*. These signals are provided to a second multiplexer 34, which is also controlled by the MUX$_{CTRL}$ signal. The output of the multiplexer 34 is applied to the input of a second delay line 38. The multiplexer 34 and delay line 38 receiving the DQS* signal operate in the same manner as the multiplexer 34 and delay line 38 receiving the DQS signal to produce an SF signal, which has a rising edge delayed from the falling edge of the DQS signal. Therefore, in the interest of brevity, an explanation of the operation of the multiplexer 34 and delay line 38 receiving the DQS* signal will not be repeated.

With further reference to FIG. 4, the SR signal is applied to the respective clock inputs of a plurality of latches 50, which, in the example shown in FIG. 4, are 8 in number. The SR signal is also applied to the clock input of a write pointer 54, which operates with the associated latch 50 as a ring buffer. As is known in the art, a write pointer sequentially advances a signal, such as a logic "1" signal, through each of a plurality of stages responsive to each transition of a signal applied to its clock input. When the final stage is reached, the signal transitions back to the first stage. The write pointer 54 includes the same number of stages as there are latches 50, so there are 8 stages in the write pointer 54. The output of each stage of the write pointer 54 is connected to an enable input of a respective one of the latches 50. As a result, each of the 8 latches 50 is enabled in sequence responsive to each rising edge of the SR signal.

The data input of the latch 50 clocked by the SR signal is coupled to the output of a relatively short delay line 56, which generates a delayed DQ signal "DQ$_{DEL1}$." The DQ$_{DEL}$ signal is generated responsive to one of the DQ signals, which is coupled through a multiplexer 55 that is controlled by a CLK1 signal. Similarly, the data input of the latch 60 clocked by the SF signal is coupled to the output of a second relatively short delay line 57, which generates another delayed DQ signal "DQ$_{DEL2}$." The DQ$_{DEL2}$ signal is generated responsive to one of the DQ signals, which is also coupled through a multiplexer 58. The multiplexer is controlled by a CLK1* signal, which is the complement of the CLK1 signal the operation of the multiplexer 55. (As mentioned above, the circuitry for processing only one DQ signal is shown for purposes of clarity, but an additional set of latches 50 would be provided for each DQ signal. Corresponding latches 50 in each additional set would be enabled by the same signals from the write pointer 54). The delay lines 56, 57 generally do not add any controllable delay to the DQ signal but are instead provided to compensate for the insertion delay of the delay line 38 when the DEL signals have set the delay of the delay lines 38 to zero delay.

The SF signal is applied to a set of eight latches 60 and a write pointer 64, which functions as a ring buffer in the same manner as the latches 50 and write pointer 54, as explained above with respect to the SR signal. Therefore, while the DQ$_{DEL1}$ signal is stored in successive latches 50 responsive to the SR signal, the DQ$_{DEL2}$ signal is also stored in successive latches 60 responsive to the SF signal. Since the SR signal is delayed by the delay value DEL from the rising edge of the DQS signal, and the SF signal is delayed by the delay value DEL from the falling edge of the DQS signal, samples of the DQ$_{DEL1}$ and DQ$_{DEL2}$ signals at times delayed from both the rising edge and the falling edge of the DQS signal are stored in the latches 50, 60, respectively.

The latches 50, 60 and write pointers 54, 64 perform the function of a phase detector when the CLK$_{DEL1}$ signal is selected by detecting when the transitions of the SR signal match the transitions of the DQ$_{DEL1}$ signal, and the CLK$_{DEL2}$ signal is selected by detecting when the transitions of the SF signal match the transitions of the DQ$_{DEL2}$ signal. The manner in which this is accomplished will be explained with reference to FIG. 5, which shows the DQ$_{DEL1}$ and DQ$_{DEL2}$ signals lagging the SR and SF signals, respectively, just slightly. At time $t_0$, the logic "0" value of the DQ$_{DEL1}$ signal is clocked into the first of the latches 50 responsive to the rising edge of the SR signal. At time $t_1$, the logic "0" value of the DQ$_{DEL2}$ signal is clocked into the first of the latches 60 responsive to the rising edge of the SF signal. Similarly, at time $t_2$, the logic "0" value of the DQ$_{DEL1}$ signal is clocked into the second of the latches 50, and, at time $t_3$, the logic "0" value of the DQ$_{DEL2}$ signal is clocked into the second of the latches 60. After 8 periods of the DQS signal, all 8 of the latches 50 and all 8 of the latches 60 will be storing a logic "0."

Figure 5:
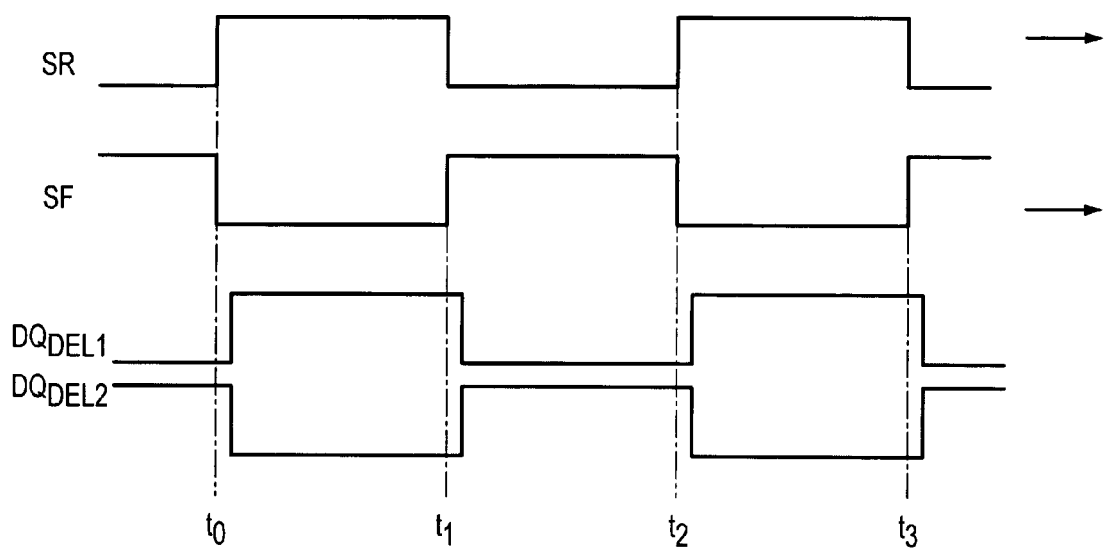
FIG. 5 is a timing diagram showing the timing relationships between signals used in the measurement circuitry of FIG. 4.

It can be seen by examining FIG. 5 that the binary values stored in the latches 50, 60 will change when the delay of the delay lines 38 increase, thereby increasing the delay of the SF and SR signals in the direction indicated by the arrows. When the delay of the delay line 38 increases so that the SF and SR signals lag the DQ signal, the latches 50, 60 will each store logic "1" values. The changeover from the logic levels stored in the latches 50, 60 to their complements thus occurs when the transitions of the DQ$_{DEL1}$ and DQ$_{DEL2}$ signals are aligned with the rising edges of the SR and SF signals, respectively.

The outputs of the latches 50, 60 are applied to an evaluation unit 70, which detects the changeover in logic values and provides an indicating signal to the control unit 40. The control unit 40 is then able to determine the value of DEL where the SR and SF signals are aligned with the DQ$_{DEL1}$ and DQ$_{DEL2}$ signals, respectively. Actually, since the delays of the DQ$_{DEL1}$ and DQ$_{DEL2}$ signals are set by the delay lines 56, 57 to be equal to the minimum delay of the delay lines 38, the value of DEL when the evaluation circuit 70 provides the indicating signal is equal to the delay of the DQ signals from the rising edge of the DQS signal.

The ability to determine the relative timing between the DQ signals and the DQS signal in this manner allows the precise measurement of timing parameters, such as maximum data set-up time $t_{DQSQ}$ and the minimum data hold time $t_{QH}$. These and other timing parameters are determined by the test circuit 20 (FIG. 3B) varying the relative timing between the read data signals and the DQS signals over a suitable range, and then determining if a memory device being tested was able to capture the DQ signals at each timing relationship. The measurement circuitry 30 shown in FIG. 4 is then used to determine magnitude of timing relationships between the read data signals and the DQS signals that are of interest. For example the test circuit 20 might determine that a memory device being tested is not sending read data with correct timing unless the DQS signal is delayed by an amount that corresponds to a DEL value of 40 applied to the delay lines 38. The test circuit 20 might subsequently determine that the memory device being tested is not sending read data with correct timing when the DQS signal is delayed by an amount that corresponds to a DEL value of 200 applied to the delay lines 38. The time corresponding to a DEL value of 40 thus corresponds to the maximum data set-up time $t_{DQSQ}$, and the DEL value of 200 thus corresponds to the minimum data hold time $t_{QH}$.

In theory, the delay value DEL at which rising edge of the DQ signal coincides with the rising edge of the SR signal can be determined by a single latch rather than a set of latches 50, 60. However, noise on signal lines can cause jitter that varies by minute amounts each cycle the relative timing between the DQ signal and the SR signal, and the relative timing between the DQ signal and the SF signal. For that reason, the evaluation circuit 70 can signal the value of DEL where the SR and SF signals are aligned with the $DQ_{DEL1}$ and $DQ_{DEL2}$ signals, resepectively, when the binary value stored in less than all of the latches 50, 60 have changed over. For example, the evaluation circuit 70 may consider the SR and SF signals to be aligned with the $DQ_{DEL1}$ and $DQ_{DEL2}$ signals, respectively, when the binary value stored in only half of the latches 50 and half of the latches 60 have changed over.

Although the measurement circuitry 30 shown in FIG. 4 can determine the DEL value corresponding to the timing of the DQS and DQS* signals relative to the DQ signal, it can be very difficult to determine the actual time corresponding to any delay value DEL. In particular, the delay provided by delay lines varies with such factors as process variations, junction temperature, and supply voltage. Yet the value of timing parameters, such as $t_{DQSQ}$ and $t_{QH}$, must be provided in values of time, such as nanoseconds. For this reason, the test circuit 20 (FIG. 3B) includes calibration circuitry 80, an example of which is shown in FIG. 6.

Once a delay value DEL for any timing parameter has been determined by the measurement circuitry 30, the calibration circuitry 80 determines the time corresponding to the delay value DEL. In the calibration mode, the control unit 40 (FIG. 4) switches the multiplexers 34 so that the $CLK_{DEL}$ and $CLK_{DEL}*$ signals are coupled to the inputs of the delay lines 38. The SR and SF signals are then the $CLK_{DEL}$ signal and the $CLK_{DEL}*$ signal, respectively, delayed by the value of DEL.

Figure 6:
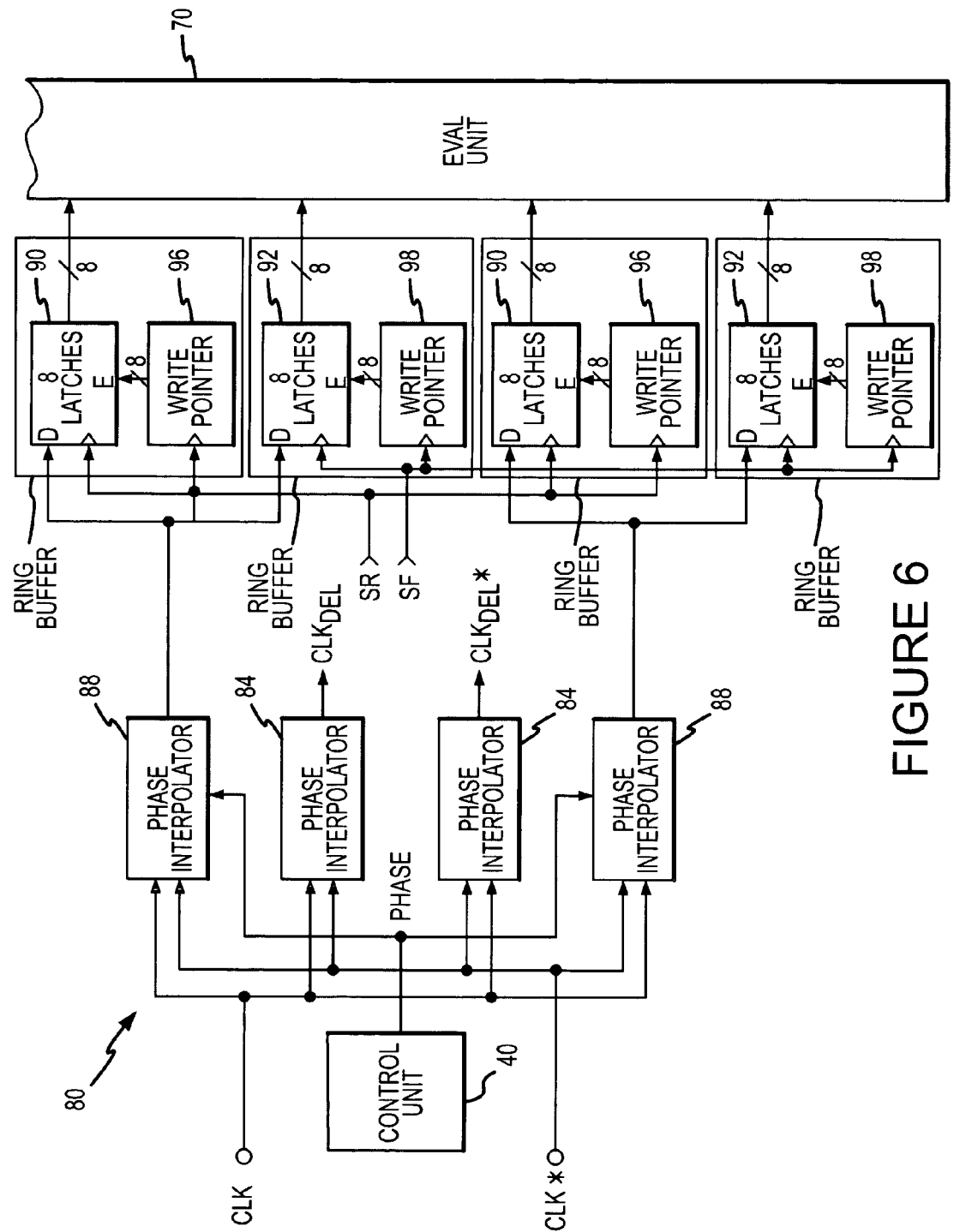
FIG. 6 is a block diagram of a calibration circuitry used in the test system of FIGS. 2 and 3 that calibrates the measurement circuitry shown in FIG. 4.

With reference to FIG. 6, the $CLK_{DEL}$ signal is generated at the output of a first phase interpolator 84 responsive to a CLK signal, and the $CLK_{DEL}*$ signal is generated at the output of a second phase interpolator 84 responsive to a complementary CLK* signal. In practice, phase interpolators impose a minimum phase offset on a signal even if the phase interpolation is set for zero. For this reason, the phase interpolation of the phase interpolator 84 is set for zero phase offset rather than by the control unit 40 to allow the phase interpolator 84 to compensate for the minimum phase offset of phase interpolators 88 to which the CLK and CLK* signals are also applied. Therefore, ignoring this minimum phase offset, the $CLK_{DEL}$ and $CLK_{DEL}*$ signals have the same phase as the CLK and CLK* signals, respectively. As a result, in the calibration phase, the SR and SF signals are delayed from the CLK and CLK* signals, respectively, by the same delay DEL that the DQ signals were determined during the measurement phase to be delayed from the DQS and DQS* signals.

The CLK and CLK* signals are also applied to respective second phase interpolators 88. The phase interpolators 88 operate by interpolating between the phase of the CLK signal and the phase of the CLK* signal responsive to a control signal PHASE from the control unit 40. As a result, the phase of the signals at the outputs of the phase interpolators 88 are offset from the CLK signal by the value of the control signal PHASE from the control unit 40. For example, the signals at the output of the phase interpolators 88 may have any of 180 different phases between the phases of the CLK and CLK* signals so that the phase of the signals are adjusted in one degree increments. The degree of precision of the phase offset provided by the phase interpolators 88 depends on the precision of the CLK and CLK* signal frequency, and is thus not adversely affected by process, temperature or supply voltage variations. The phase interpolators 88 can, for example, vary the phase offset of the output signal in 1 nanosecond increments by using CLK and CLK* signals having a frequency of 5 mHz and using a phase interpolator having 100 phase increments. Although the PHASE signal is generated by the same control unit 40 that is used to generate the signals shown in FIG. 4, it will be understood that a different control unit may be used.

In operation, the output of the phase interpolator 88 is applied to the data inputs of a first set of latches 90 and a second set of latches 92. The latches 90 are clocked by the SR signal, and the latches 92 are clocked by the SF signal. The SR and SF signals are also coupled to the clock inputs of respective write pointers 96, 98, which selectively enable the latches 90, 92, respectively.

The latches 90, 92 and the write pointers 96, 98 operate as ring buffers in the same manner as the latches 50, 60 and write pointers 54, 64 to compare the timing of the SR and SF signals to the timing of the delayed clock signal at the output of the phase interpolator 88. The outputs of the latches 90, 92 are applied to an evaluation circuit 100, which provides an indication signal to the control unit 40 when the transitions of the SR and SF signals coincide with the transitions of the signal at the output of the phase interpolator. The evaluation circuit 70 is shown as the same evaluation circuit 70 that receives the outputs from the latches 50, 60 in the measurement circuitry 30 (FIG. 4). However, a different evaluation unit may be used. As before, the evaluation circuit 70 preferably signals that the transitions of the SR and SF signals coincide with the transitions of the delayed CLK signal at the output of the phase interpolator 88 when a predetermined percentage, such as half, of the binary signals stored in the latches 90, 92 have changed state to their complements.

The calibration circuitry 80 shown in FIG. 6 also includes a second set of phase interpolators 84, 88. These phase interpolators 84, 88 operate by interpolating between the phase of the complimentary CLK* signal and the phase of the CLK signal responsive to the PHASE signal from the control unit 40. As a result, the signals at the outputs of the phase interpolators 84, 88 have an offset from the phase of the CLK* signal corresponding to the control signal PHASE from the control unit 40. The calibration circuitry 80 also includes a second set of latches 90, 92 and write pointers 96, 98 for comparing the timing of a delayed version of the complementary clock signal CLK* to the timing of the SR and SF signals. These components operate as a phase detector in the same manner as explained above to determine when the transitions the SR and SF signals coincide with the transitions of the delayed CLK* signal at the output of the phase interpolator 88. Although these components may not be necessary where extreme accuracy is not required, comparing the timing of the delayed CLK* signal to the timing of the SF and SF signals can allow the measurement to be insensitive to small variations of the duty cycle of the CLK, CLK*, DQS, and DQS* signals.

The delay time corresponding to any delay value DEL of the delay lines 38 can be determined using the calibration circuitry 80 by stepping the phase interpolators 88 to incrementally increase the phase offset of the delayed CLK and CLK* signals over a suitable range until the transitions of the SR and SF signals coincide with the transitions of the delayed CLK and CLK* signals. As explained above, the SR and SF signals are delayed from the CLK and CLK* signals, respectively, by the delay DEL that the DQ signal was found to be delayed from the DQS and DQS* signals during the measurement phase. Therefore, when the phase interpolators 88 have offset the phases of the CLK and CLK* signals so that they have the same phase as the $CLK_{DEL}$ and $CLK_{DEL}*$ signals, respectively, the phase offset provided by the phase interpolators 88 is equal to the delay DEL provided by the delay lines 38. The magnitude of the phase offsets determined by the PHASE signal from the control unit 40 when the evaluation circuit 70 signals a match thus allows the control unit 40 to determine the time magnitude of the delay corresponding to the value of DEL used by the delay lines 38. Using the above example of a DEL value of 40 corresponding to the maximum data set-up time $t_{DQSQ}$, the evaluation circuit 70 may signal a match when the PHASE signal sets a phase offset in the phase interpolators of 88 of 5 ns. The maximum data set-up time $t_{DQSQ}$ is thereby determined to be 5 ns. Similarly, using the above example of a DEL value of 200 corresponding to the minimum data hold time $t_{QH}$, the evaluation circuit 70 may signal a match when the PHASE signal sets a phase offset in the phase interpolators of 88 of 25 ns. The minimum data hold time $t_{QH}$ is thereby determined to be 25 ns.

It should be pointed out that the advantages to using a phase interpolator instead of a delay line, i.e., the inherent precision of the delay provided by a phase interpolator and its insensitivity to process, temperature and supply voltage variations, would make it desirable to use a phase interpolator to delay the DQS and DQS* signals rather than using the delay lines 38 for that purpose. Using a phase interpolator instead of a delay line would make it unnecessary to go through a calibration procedure. Unfortunately, phase interpolators require a periodic input signal, and the DQS and DQS* signals are generally not periodic. It is therefore not possible to use a phase interpolator in place of the delay lines 38.

The operation of the measurement circuitry 30 and the calibration circuitry 80 have been explained in the context of determining a delay value DEL in the measurement phase, and then determining the time corresponding to the delay value DEL in the calibration phase. Alternatively, the calibration phase could be used before the measurement phase by determining the respective times corresponding to all possible delay values DEL. Once a particular delay value DEL for a timing parameter was determined during the measurement phase, the time value of the timing parameter would also be known.

Although the present invention has been described with reference to the disclosed examples, persons skilled in the art will recognize that changes may be made in form and detail without departing from the spirit and scope of the invention. For example, although the outputs of the delay lines 38 are applied to the clock inputs of the latches 50, 60, 90, 92 in the disclosed examples, it should be understood that the outputs of the delay lines 38 could instead be applied to the data inputs of such latches 50, 60, 90, 92. The latches 50, 60, 90, 92 and the corresponding write pointers 54, 64, 96, 98, respectively, would then be clocked by the signals that were applied to the data inputs in the examples explained above. Also, although the same control unit 40 and evaluation unit 70 is used for both the measurement circuitry 30 and the calibration circuitry 80, separate units may also be used. Still another example, phase detectors may be implemented by means other than latches and write pointers to compare the timing of the SF and SR signals to the timing of the $DQ_{DEL}$ signal and/or the timing of the phase offset CLK and CLK* signals. Such modifications are well within the skill of those ordinarily skilled in the art. Accordingly, the invention is not limited except as by the appended claims.

I claim:

1. A system for measuring the delay time between first and second signals, comprising:

a first delay line having an input coupled to receive the first signal in a measurement mode and to receive a periodic signal in a calibration mode, the first delay line being operable to generate from the first signal or the periodic signal a delayed signal with a delay corresponding to a delay value;

a first comparator operable in the measurement mode to compare the timing of the delayed signal with the timing of the second signal and to generate a first match signal when transitions of the delayed signal substantially coincide with transitions of the second signal, the delay value being used by the first delay line when the first match signal is generated being used by the first delay line in the calibration mode;

a phase interpolator coupled to receive the periodic signal, the phase interpolator being operable to phase offset the periodic signal by a magnitude corresponding to a phase value to generate a phase-offset signal;

a second comparator operable in the calibration mode to compare the timing of the delayed signal with the timing of the phase-offset signal and to generate a second match signal when transitions of the delayed signal substantially coincide with transitions of the phase offset signal; and a control unit coupled to the delay line, the phase interpolator and the first and second comparators, the control unit being operable to apply the delay value to the first delay line that was being applied to the first delay line when the first match signal was generated, the control unit further being operable to apply a series of phase values to the phase interpolator that causes the phase interpolator to phase offset the periodic signal over a range of phases until the second match signal is generated, the phase value being applied to the phase interpolator when the second match signal is generated providing an indication of the delay between the first and second signals.

2. The system of claim 1 wherein the first comparator comprises at least one latch having a data input coupled to receive one of the delayed signal and the second signal, and a clock input coupled to receive the other of the delayed signal and the second signal, the at least one latch storing a binary value that changes state to provide the first match signal when transitions of the delayed signal substantially coincide with transitions of the second signal.

3. The system of claim 2 wherein the first comparator comprises:

a plurality of latches each of which has a data input, an output, and a clock input, the data input of all of the latches being coupled to receive one of the delayed signal and the second signal, and the clock inputs of all of the latches being coupled to receive the other of the delayed signal and the second signal, each of the latches having an enable input operable to receive an enable signal to allow the latch to store and then output a binary value that changes state when transitions of the delayed signal substantially coincide with transitions of the second signal;

a ring buffer clocked by the signal applied to the clock inputs of the latches, the ring buffer having a plurality of stages each of which is coupled to the enable input of a respective one of the latches, the ring buffer being operable to sequentially apply an enable signal to each of the latches; and an evaluation unit coupled to the outputs of the latches, the evaluation unit providing the first match signal responsive to the respective binary values output by a predetermined number of the latches changing state.

4. The system of claim 3 wherein the evaluation unit is operable to provide the first match signal responsive to the respective binary values output by half of the latches changing state.

5. The system of claim 1, further comprising:
a second delay line having an input coupled to receive a complement of the first signal in a measurement mode and to receive a complement of the periodic signal in a calibration mode, the delay line being operable to generate from the complement of the first signal or the complement of the periodic signal a delayed complementary signal with a delay corresponding to the delay value;
a third comparator operable in the measurement mode to compare the timing of the delayed complementary signal with the timing of the complement of the second signal and to generate a third match signal when transitions of the delayed complementary signal substantially coincide with transitions of the complement of the second signal, the delay value being used by the first and second delay lines when both the first match signal and the third match signal are generated being used by the first and second delay lines in the calibration mode;
a second phase interpolator coupled to receive the complement of the periodic signal, the second phase interpolator being operable to phase offset the periodic signal by a magnitude corresponding to the phase value to generate a complementary phase offset signal;
a fourth comparator operable in the calibration mode to compare the timing of the delayed complementary signal with the timing of the complementary phase offset signal and to generate a fourth match signal when transitions of the delayed complementary signal substantially coincide with transitions of the complementary phase offset signal; and
an evaluation unit coupled to the second and fourth comparators, the evaluation unit providing the indication of the delay between the first and second signals based on the phase value being applied to the phase interpolator when the second and fourth match signals are generated.

6. The system of claim 1, further comprising a second delay line through which the second signal is coupled before being applied to the first comparator, the second delay line being substantially identical to the first delay line to compensate for fixed delays in the first delay line.

7. The system of claim 1, further comprising a second phase interpolator through which the periodic signal is coupled before being applied to the first delay line, the second phase interpolator being substantially identical to the first phase interpolator to compensate for fixed delays in the first phase interpolator.

8. The system of claim 1 wherein at least one of the first and second signals comprise a non-periodic signal.

9. The system of claim 8 wherein at least one of the first and second signals comprise a memory device data signal, and wherein the other of the first and second signals comprise a data strobe signal.

10. A system for measuring the delay time between first and second signals, comprising:
a selector coupled to receive the first signal and a periodic signal, the selector being operable responsive to a select signal to couple a selected one of the first signal and the periodic signal to an output;
a delay line having an input coupled to the output of the selector to receive either the first signal or the periodic signal, the delay line being operable to generate from the first signal or the periodic signal a delayed signal with a delay corresponding to a delay value;
a first latch having an output and a data input coupled to receive one of the delayed signal and the second signal, and a clock input coupled to receive the other of the delayed signal and the second signal;
a phase interpolator coupled to receive the periodic signal, the phase interpolator being operable to phase offset the periodic signal by a magnitude corresponding to a phase value to generate a phase offset signal;
a second latch having an output and a data input coupled to receive one of the delayed signal and the phase offset signal, and a clock input coupled to receive the other of the delayed signal and the phase offset signal;
an evaluation unit coupled to the outputs of the first and second latches, the evaluation unit being operable to determine when a binary value stored in each of the latches changes state, the evaluation unit being operable to output a first indication signal responsive to the output of the first latch changing state, and to output a second indication signal responsive to the output of the second latch changing state; and
a control unit coupled to the selector, the delay line, the phase interpolator and the evaluation unit, the control unit being operable in a measurement mode to apply a select signal to the selector that couples the first signal to the input of the delay line, to apply a series of delay values to the delay line that causes the delay line to delay the first signal over a range of delays, and to save the delay value that is being applied to the delay line when the control unit receives the first indication signal from the evaluation unit, the control unit being operable in a calibration mode to apply a select signal to the selector that couples the periodic signal to the input of the delay line, to apply a series of phase values to the phase interpolator that causes the phase interpolator to phase offset the periodic signal over a range of phases, and to save the phase value that is being applied to the phase interpolator when the control unit receives the second indication signal from the evaluation unit, the phase value providing an indication of the delay time corresponding to the saved delay value and providing an indication of the delay between the first and second signals.

11. The system of claim 10 wherein the selector comprises a multiplexer operable to couple the first signal to the output responsive to one value of the select signal and operable to couple the periodic signal to the output responsive to a second value of the select signal.

12. The system of claim 10, further comprising:
a plurality of first latches each of which has a data input, an output, and a clock input, the data input of all of the first latches being coupled to receive one of the delayed signal and the second signal, and the clock inputs of all of the first latches being coupled to receive the other of the delayed signal and the second signal, each of the first latches having an enable input operable to receive an enable signal to allow the first latch to store and then output a binary value that changes state when transitions of the delayed signal substantially coincide with transitions of the second signal, the outputs of the first latches being coupled to the evaluation unit, the evaluation unit generating the first indication signal responsive to the outputs of a predetermined number of the first latches changing state; and a ring buffer clocked by the signal applied to the clock inputs of the first latches, the ring buffer having a plurality of stages each of which is coupled to the enable input of a respective one of the first latches, the ring buffer being operable to sequentially apply an enable signal to each of the first latches.

13. The system of claim 12 wherein the evaluation unit is operable to provide the first indication signal responsive to the outputs of half of the first latches changing state.

14. The system of claim 10, further comprising:

a second selector coupled to receive the complement of the first signal and the complement of the periodic signal, the second selector being operable responsive to the select signal to couple a selected one of the complement of the first signal and the complement of the periodic signal to an output;

a second delay line having an input coupled to the output of the second selector to receive either the complement of the first signal or the complement of the periodic signal, the second delay line being operable to generate from the complement of the first signal or the complement of the periodic signal a complementary delayed signal with a delay corresponding to the delay value;

a third latch having an output and a data input coupled to receive one of the complementary delayed signal and the complement of the second signal, and a clock input coupled to receive the other of the complementary delayed signal and the complement of the second signal;

a second phase interpolator coupled to receive the complement of the periodic signal, the second phase interpolator being operable to phase offset the complement of the periodic signal by a magnitude corresponding to the phase value to generate a complementary phase offset signal;

a fourth latch having an output and a data input coupled to receive one of the complementary delayed signal and the complementary phase offset signal, and a clock input coupled to receive the other of the complementary delayed signal and the complementary phase offset signal; and wherein the evaluation unit is further coupled to the outputs of the third and fourth latches and is further operable to determine when a binary value stored in each of the third and fourth latches changes state, the evaluation unit being operable to output the first indication signal responsive to the outputs of both the first and third latches changing state, and to output the second indication signal responsive to the outputs of both the second and fourth latches changing state.

15. The system of claim 10, further comprising a second delay line through which the second signal is coupled before being applied to the first comparator, the second delay line being substantially identical to the first delay line to compensate for fixed delays in the first delay line.

16. The system of claim 10, further comprising a second phase interpolator through which the periodic signal is coupled before being applied to the first delay line, the second phase interpolator being substantially identical to the first phase interpolator to compensate for fixed delays in the first phase interpolator.

17. The system of claim 10 wherein at least one of the first and second signals comprise a non-periodic signal.

18. The system of claim 17 wherein at least one of the first and second signals comprise a memory device data signal, and wherein the other of the first and second signals comprise a data strobe signal.

19. An integrated circuit testing device, comprising:

a test circuit being operable to output test signals and to receive response signals, the test circuit having an output port from which test results data derived from the response signals are output; and timing margin measurement circuitry included in the test circuit for obtaining timing measurements from first and second response signals received by the test circuit, the timing margin measurement circuitry comprising:

a first delay line having an input coupled to receive the first response signal in a measurement mode and to receive a periodic signal in a calibration mode, the first delay line being operable to generate from the first response signal or the periodic signal a first delayed signal with a delay corresponding to a first delay value;

a first comparator operable in the measurement mode to compare the timing of the first delayed signal with the timing of the second response signal and to generate a first match signal when transitions of the first delayed signal substantially coincide with transitions of the second response signal, the first delay value being used by the first delay line when the first match signal is generated being used by the first delay line in the calibration mode;

a delay generator coupled to receive the periodic signal, the delay generator being operable to precisely delay the periodic signal by a delay corresponding to a second delay value to generate a second delayed signal;

a second comparator operable in the calibration mode to compare the timing of the first delayed signal with the timing of the second delayed signal and to generate a second match signal when transitions of the first delayed signal substantially coincide with transitions of the second delayed signal; and a control unit coupled to the delay line, the delay generator and the first and second comparators, the control unit being operable to apply the first delay value to the delay line that was being applied to the delay line when the first match signal was generated, the control unit further being operable to apply a series of second delay values to the delay generator that cause the delay generator to delay the periodic signal over a range of delays until the second match signal is generated, the second delay value being applied to the delay generator when the second match signal is generated providing an indication of the delay between the first and second response signals.

20. The integrated circuit testing device of claim 19 wherein the delay generator comprises a phase interpolator coupled to receive the periodic signal, the phase interpolator being operable to phase offset the periodic signal by a magnitude corresponding to the second delay value to generate the second delayed signal.

21. The integrated circuit testing device of claim 19 wherein the first comparator comprises at least one latch having a data input coupled to receive one of the first delayed signal and the response second signal, and a clock input coupled to receive the other of the first delayed signal and the second response signal, the at least one latch storing a binary value that changes state to provide the first match signal when transitions of the first delayed signal substantially coincide with transitions of the second response signal.

22. The integrated circuit testing device of claim 21 wherein the first comparator comprises:
   a plurality of latches each of which has a data input, an output, and a clock input, the data input of all of the latches being coupled to receive one of the delayed signal and the second response signal, and the clock inputs of all of the latches being coupled to receive the other of the delayed signal and the second response signal, each of the latches having an enable input operable to receive an enable signal to allow the latch to store and then output a binary value that changes state when transitions of the delayed signal substantially coincide with transitions of the second response signal;
   a ring buffer clocked by the signal applied to the clock inputs of the latches, the ring buffer having a plurality of stages each of which is coupled to the enable input of a respective one of the latches, the ring buffer being operable to sequentially apply an enable signal to each of the latches; and
   an evaluation unit coupled to the outputs of the latches, the evaluation unit providing the first match signal responsive to the respective binary values output by a predetermined number of the latches changing state.

23. The integrated circuit testing device of claim 22 wherein the evaluation unit is operable to provide the first match signal responsive to the respective binary values output by half of the latches changing state.

24. The integrated circuit testing device of claim 19, further comprising:
   a second delay line having an input coupled to receive a complement of the first response signal in a measurement mode and to receive a complement of the periodic signal in a calibration mode, the second delay line being operable to generate from the complement of the first response signal or the complement of the periodic signal a delayed complementary signal with a delay corresponding to the first delay value;
   a third comparator operable in the measurement mode to compare the timing of the delayed complementary signal with the timing of the complement of the second response signal and to generate a third match signal when transitions of the delayed complementary signal substantially coincide with transitions of the complement of the second response signal, the first delay value being used by the first and second delay lines when both the first match signal and the third match signal are generated being used by the first and second delay lines in the calibration mode;
   a second delay generator coupled to receive the complement of the periodic signal, the second delay generator being operable to precisely delay the complement of the periodic signal by a delay corresponding to the second delay value to generate a complementary delayed signal;
   a fourth comparator operable in the calibration mode to compare the timing of the delayed complementary signal with the timing of the complementary phase offset signal and to generate a fourth match signal when transitions of the delayed complementary signal substantially coincide with transitions of the complementary phase offset signal; and
   wherein the evaluation unit is further coupled to the second and fourth comparators, the evaluation unit providing the indication of the delay between the first and second response signals based on the second delay value being applied to the delay generator when the second and fourth match signals are generated.

25. The integrated circuit testing device of claim 19, further comprising a second delay line through which the second response signal is coupled before being applied to the first comparator, the second delay line being substantially identical to the first delay line to compensate for fixed delays in the first delay line.

26. The integrated circuit testing device of claim 19, further comprising a second delay generator through which the periodic signal is coupled before being applied to the first delay line, the second delay generator being substantially identical to the first delay generator to compensate for fixed delays in the first delay generator.

27. The integrated circuit testing device of claim 19 wherein at least one of the first and second response signals comprise a non-periodic signal.

28. The integrated circuit testing device of claim 27 wherein at least one of the first and second signals comprise a memory device data signal, and wherein the other of the first and second signals comprise a data strobe signal.

29. An integrated circuit load board, comprising:
   a substrate;
   a plurality of integrated circuit sockets mounted on the substrate; and
   an integrated test circuit mounted on the substrate and coupled to the integrated circuit sockets, the integrated test circuit being operable to apply test signals to the integrated circuit sockets and to receive response signals from the integrated circuit sockets, the integrated test circuit having an output port from which test results data derived from the response signals are output, the integrated test circuit including timing margin measurement circuitry included in the test circuit for obtaining timing measurements from first and second response signals received by the test circuit, the timing margin measurement circuitry comprising:
      a first delay line having an input coupled to receive the first response signal in a measurement mode and to receive a periodic signal in a calibration mode, the first delay line being operable to generate from the first response signal or the periodic signal a first delayed signal with a delay corresponding to a first delay value;
      a first comparator operable in the measurement mode to compare the timing of the first delayed signal with the timing of the second response signal and to generate a first match signal when transitions of the first delayed signal substantially coincide with transitions of the second response signal, the first delay value being used by the first delay line when the first match signal is generated being used by the first delay line in the calibration mode;
      a delay generator coupled to receive the periodic signal, the delay generator being operable to precisely delay the periodic signal by a delay corresponding to a second delay value to generate a second delayed signal;
      a second comparator operable in the calibration mode to compare the timing of the first delayed signal with the timing of the second delayed signal and to generate a second match signal when transitions of the first delayed signal substantially coincide with transitions of the second delayed signal; and
      a control unit coupled to the delay line, the delay generator and the first and second comparators, the control unit being operable to apply the first delay value to the delay line that was being applied to the delay line when the first match signal was generated, the control unit further being operable to apply a series of second delay values to the delay generator that cause the delay generator to delay the periodic signal over a range of delays until the second match signal is generated, the second delay value being applied to the delay generator when the second match signal is generated providing an indication of the delay between the first and second response signals.

30. The load board of claim 29 wherein the delay generator comprises a phase interpolator coupled to receive the periodic signal, the phase interpolator being operable to phase offset the periodic signal by a magnitude corresponding to the second delay value to generate the second delayed signal.

31. The load board of claim 29 wherein the first comparator comprises at least one latch having a data input coupled to receive one of the first delayed signal and the response second signal, and a clock input coupled to receive the other of the first delayed signal and the second response signal, the at least one latch storing a binary value that changes state to provide the first match signal when transitions of the first delayed signal substantially coincide with transitions of the second response signal.

32. The load board of claim 31 wherein the first comparator comprises:
   a plurality of latches each of which has a data input, an output, and a clock input, the data input of all of the latches being coupled to receive one of the delayed signal and the second response signal, and the clock inputs of all of the latches being coupled to receive the other of the delayed signal and the second response signal, each of the latches having an enable input operable to receive an enable signal to allow the latch to store and then output a binary value that changes state when transitions of the delayed signal substantially coincide with transitions of the second response signal;
   a ring buffer clocked by the signal applied to the clock inputs of the latches, the ring buffer having a plurality of stages each of which is coupled to the enable input of a respective one of the latches, the ring buffer being operable to sequentially apply an enable signal to each of the latches; and
   an evaluation unit coupled to the outputs of the latches, the evaluation unit providing the first match signal responsive to the respective binary values output by a predetermined number of the latches changing state.

33. The load board of claim 32 wherein the evaluation unit is operable to provide the first match signal responsive to the respective binary values output by half of the latches changing state.

34. The load board of claim 29, further comprising:
   a second delay line having an input coupled to receive a complement of the first response signal in a measurement mode and to receive a complement of the periodic signal in a calibration mode, the second delay line being operable to generate from the complement of the first response signal or the complement of the periodic signal a delayed complementary signal with a delay corresponding to the first delay value;
   a third comparator operable in the measurement mode to compare the timing of the delayed complementary signal with the timing of the complement of the second response signal and to generate a third match signal when transitions of the delayed complementary signal substantially coincide with transitions of the complement of the second response signal, the first delay value being used by the first and second delay lines when both the first match signal and the third match signal are generated being used by the first and second delay lines in the calibration mode;
   a second delay generator coupled to receive the complement of the periodic signal, the second delay generator being operable to precisely delay the complement of the periodic signal by a delay corresponding to the second delay value to generate a complementary delayed signal;
   a fourth comparator operable in the calibration mode to compare the timing of the delayed complementary signal with the timing of the complementary phase offset signal and to generate a fourth match signal when transitions of the delayed complementary signal substantially coincide with transitions of the complementary phase offset signal; and
   wherein the evaluation unit is further coupled to the second and fourth comparators, the evaluation unit providing the indication of the delay between the first and second response signals based on the second delay value being applied to the delay generator when the second and fourth match signals are generated.

35. The load board of claim 29, further comprising a second delay line through which the second response signal is coupled before being applied to the first comparator, the second delay line being substantially identical to the first delay line to compensate for fixed delays in the first delay line.

36. The load board of claim 29, further comprising a second delay generator through which the periodic signal is coupled before being applied to the first delay line, the second delay generator being substantially identical to the first delay generator to compensate for fixed delays in the first delay generator.

37. The load board of claim 29 wherein at least one of the first and second response signals comprise a non-periodic signal.

38. The load board of claim 29, further comprising a respective integrated circuit in each of the integrated circuit sockets in communication with the integrated test circuit.

39. The load board of claim 38 wherein each of the integrated circuits comprise a dynamic random access memory device.

40. The load board of claim 39 wherein at least one of the first and second response signals comprise a memory device data signal, and wherein the other of the first and second response signals comprise a data strobe signal.

* * * * *